United States Patent
Ho

(10) Patent No.: US 11,107,534 B2
(45) Date of Patent: Aug. 31, 2021

(54) MEMORY DEVICE AND CONTROL METHOD THEREOF FOR FAST READ

(71) Applicant: Winbond Electronics Corp., Taichung (TW)

(72) Inventor: Wen-Chiao Ho, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/558,792

(22) Filed: Sep. 3, 2019

(65) Prior Publication Data
US 2021/0065814 A1    Mar. 4, 2021

(51) Int. Cl.
*G11C 16/08*    (2006.01)
*G11C 16/26*    (2006.01)
*G11C 16/24*    (2006.01)

(52) U.S. Cl.
CPC ............. *G11C 16/26* (2013.01); *G11C 16/08* (2013.01); *G11C 16/24* (2013.01)

(58) Field of Classification Search
CPC ....................................... G11C 16/08
USPC ....................................... 365/185.02
See application file for complete search history.

(56) References Cited

U.S. PATENT DOCUMENTS

| | | | |
|---|---|---|---|
| 6,107,659 A | 8/2000 | Onakado et al. | |
| 6,345,000 B1 | 2/2002 | Wong et al. | |
| 10,062,440 B1 * | 8/2018 | Ryoo | G11C 16/08 |
| 2014/0063970 A1 | 3/2014 | Yano et al. | |

* cited by examiner

*Primary Examiner* — Jason Lappas
(74) *Attorney, Agent, or Firm* — Muncy, Geissler, Olds & Lowe, P.C.

(57) ABSTRACT

A memory device includes a memory array. The memory array has a plurality of memory cells arranged in rows and columns. The gates of the memory cells in the same row are coupled to each other and connected to a word line. The drains of the memory cells in the same column are coupled to each other and connected to a bit line. The sources of the memory cells in the same row are coupled to each other, and the sources of the memory cells in the two adjacent rows are connected to different respective source lines.

11 Claims, 7 Drawing Sheets

MEMORY DEVICE AND CONTROL METHOD THEREOF FOR FAST READ

FIELD OF THE INVENTION

The invention relates in general to a memory device, and it relates in particular to a memory device and a control method thereof for fast read.

DESCRIPTION OF THE RELATED ART

Every memory cell in a NOR flash memory is connected to a word line and a bit line, and the random access speed of a NOR flash memory is faster than that of a NAND flash memory. NOR flash memory with small storage capacity and low write speeds are mainly used for storing code.

As shown in FIG. 1, for example, when a memory cell 100 is read, a voltage of 5V is provided to a word line WL(n) connected to the gate of the memory cell 100, a voltage of 1V is provided to a bit line BL connected to the drain of the memory cell 100, and a voltage of 0V is provided to a source line SL connected to the source of the memory cell 100. Under the conditions described above, the memory cell 100 is turned on, and because the voltage at the drain of the memory cell 100 is higher than that at the source of the memory cell 100, there is a current I-cell flowing from the drain to the source of the memory cell 100. The memory compares the current I-cell with a reference current to determine whether the data stored in the memory cell 100 is at logic high level or logic low level.

Among the various read commands of a SPI-NOR flash memory, there is a special read command called a fast read command. When the SPI-NOR flash memory receives a fast read command, the memory begins to read continuously from a specific memory cell corresponding to an address of the fast read command. And after reading the row corresponding to the specific memory cell, the other memory cells in the next row of the specific memory cell are read sequentially, until all of the memory cells in the memory have been read.

FIG. 2 is a schematic diagram of a memory array of a memory when reading is performed. As shown in FIG. 2, for example, a memory array 200 is composed of a plurality of memory cells of n rows and m columns, wherein a memory cell 202 is located in the first row of the m-th column. When the memory cell 202 is read, the voltage at the word line WL[0] of the first row corresponding to the memory cell 202 is 5V, the voltage at the bit line BL[m−1] of the m-th column corresponding to the memory cell 202 is 1V, and the voltage at the source line SL corresponding to the memory cell 202 is 0V. At this time, the memory cell 200 can be read smoothly. After finishing the reading of the memory cell 200, the memory then reads a memory cell 204 in the second row of the first column.

In the process of converting a read target of the memory from memory cell 202 to memory cell 204, since memory cell 202 and memory cell 204 belong to different rows, a word line controller must stop outputting the voltage of 5V to the word line WL[0] corresponding to memory cell 202, and start to output the voltage of 5V to the word line WL[1] corresponding to memory cell 204. Since in the semiconductor process, word lines are mostly made of polycrystalline silicon, the electrical conduction speed of the polycrystalline silicon is not as fast as bit lines made of metal, the switching speed between word lines often becomes a bottleneck, slowing down the memory reading speed. However, if the word line controller simultaneously provides 5V to the word line WL[0] and the word line WL[1], as shown in FIG. 1, two currents respectively flows from the drain to the source of both the memory cell 202 and the memory cell 204, so that the total current detected by the memory is incorrect which causes the memory to misjudge the logic of memory cell 202 or memory cell 204.

BRIEF SUMMARY OF THE INVENTION

In order to resolve the problem described above, the present invention discloses a memory device including a memory array, comprised of a plurality of memory cells arranged in rows and columns; wherein the gates of the memory cells in the same row are coupled to each other and connected to a word line; the drains of the memory cells in the same column are coupled to each other and connected to a bit line; the sources of the memory cells in the same row are coupled to each other, and the sources of the memory cells in the two adjacent rows are connected to different respective source lines.

The present invention also discloses a control method of a memory device. The memory device includes a memory array, a word line controller, a source line controller, and a bit line controller. The memory array is comprised of a plurality of memory cells arranged in rows and columns. The gates of the memory cells in the same row are coupled to each other and connected to a word line. The drains of the memory cells in the same column are coupled to each other and connected to a bit line. The sources of the memory cells in the same row are coupled to each other, and the sources of the memory cells in the two adjacent rows are respectively connected to a first source line and a second source line. The control method includes: when a target memory cell whose source is connected to the first source line needs to be read, the word line controller provides a first voltage to a word line corresponding to the target memory cell and also provides the first voltage to a word line corresponding to the next row of the target memory cell, so that the period when the word line corresponding to the target memory cell remains at the first voltage overlaps the period when the word line corresponding to the next row of the target memory cell remains at the first voltage; when the target memory cell needs to be read, the source line controller provides a second voltage to the first source line, and provides a third voltage to the second source line; the third voltage is not equal to the second voltage.

The present invention also discloses another control method of a memory device. The memory device includes a memory array. The memory array is comprised of a plurality of memory cells arranged in rows and columns. The gates of the memory cells in the same row are coupled to each other and connected to a word line. The drains of the memory cells in the same column are coupled to each other and connected to a bit line. The sources of the memory cells in the same row are coupled to each other, and the sources of the memory cells in the two adjacent rows are connected to different respective source lines. A first memory cell is located in one of the plurality of rows and is located in the last column. A second memory cell is located in a row next to the row where the first memory cell is located and is located in the last column. A third memory cell is located in a row next to the row where the second memory cell is located and is located in the last column. A fourth memory cell is located in a row next to the row where the first memory cell is located and is located in the first column. When the first memory cell is read, the control method includes: providing a first voltage to a word line connected to the first memory cell, providing a second voltage to a source line connected to the first memory cell, and providing a third voltage to a bit line connected to the first memory cell, wherein the third voltage is higher than the second voltage; providing the first voltage to a word line connected to the fourth memory cell, providing a fourth voltage to a source line connected to the second memory cell, and providing the second voltage to a source line connected to the third memory cell; wherein the fourth voltage is equal to the third voltage; and stopping the first voltage to the word line connected to the first memory cell.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 1:
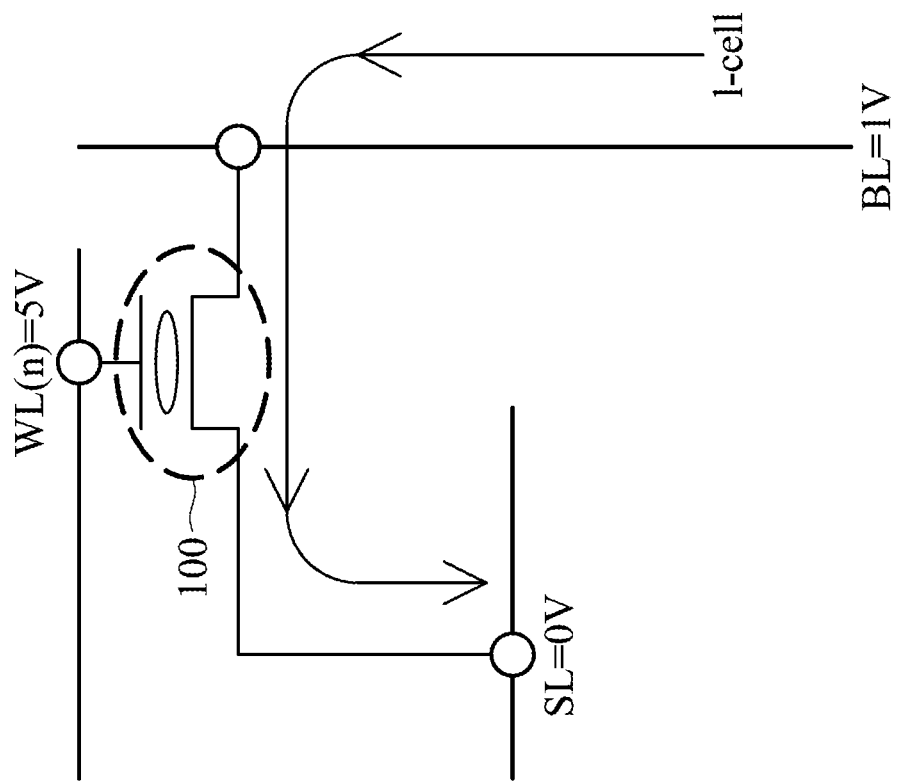
FIG. 1 is a schematic diagram of a current flow when a memory cell of a memory is read.
Figure 2:
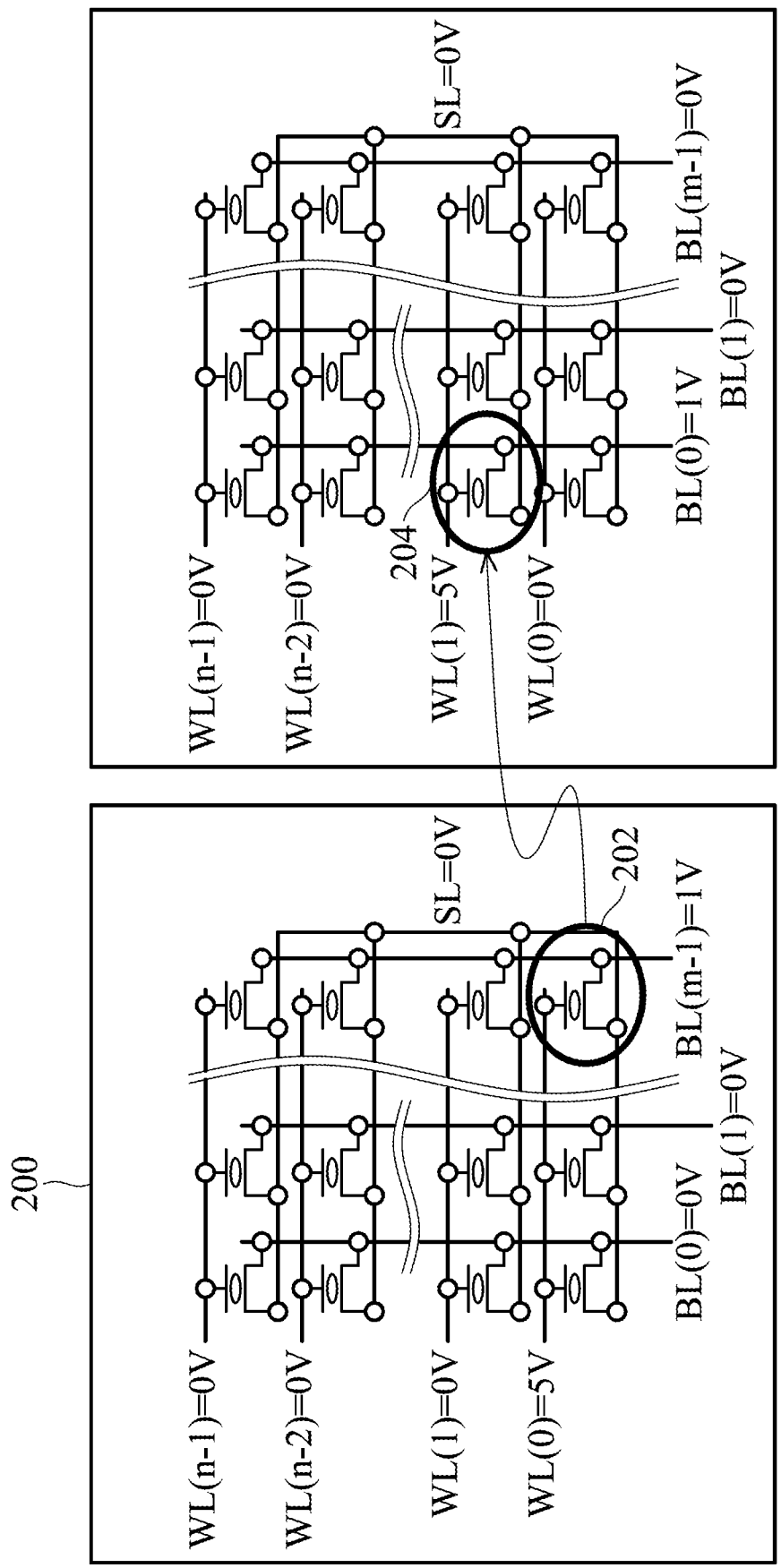
FIG. 2 is a schematic diagram of a memory array of a memory when reading is performed.
Figure 3:
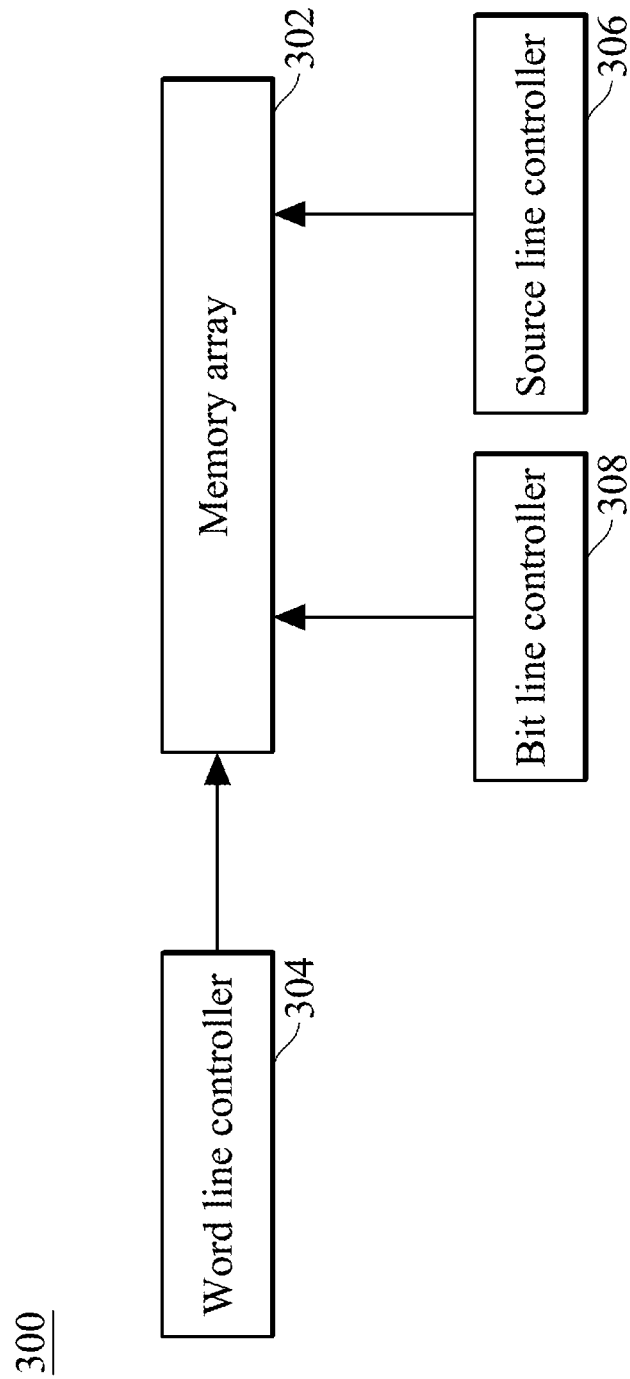
FIG. 3 is a schematic diagram of a memory device in accordance with an embodiment of the disclosure.
Figure 4:
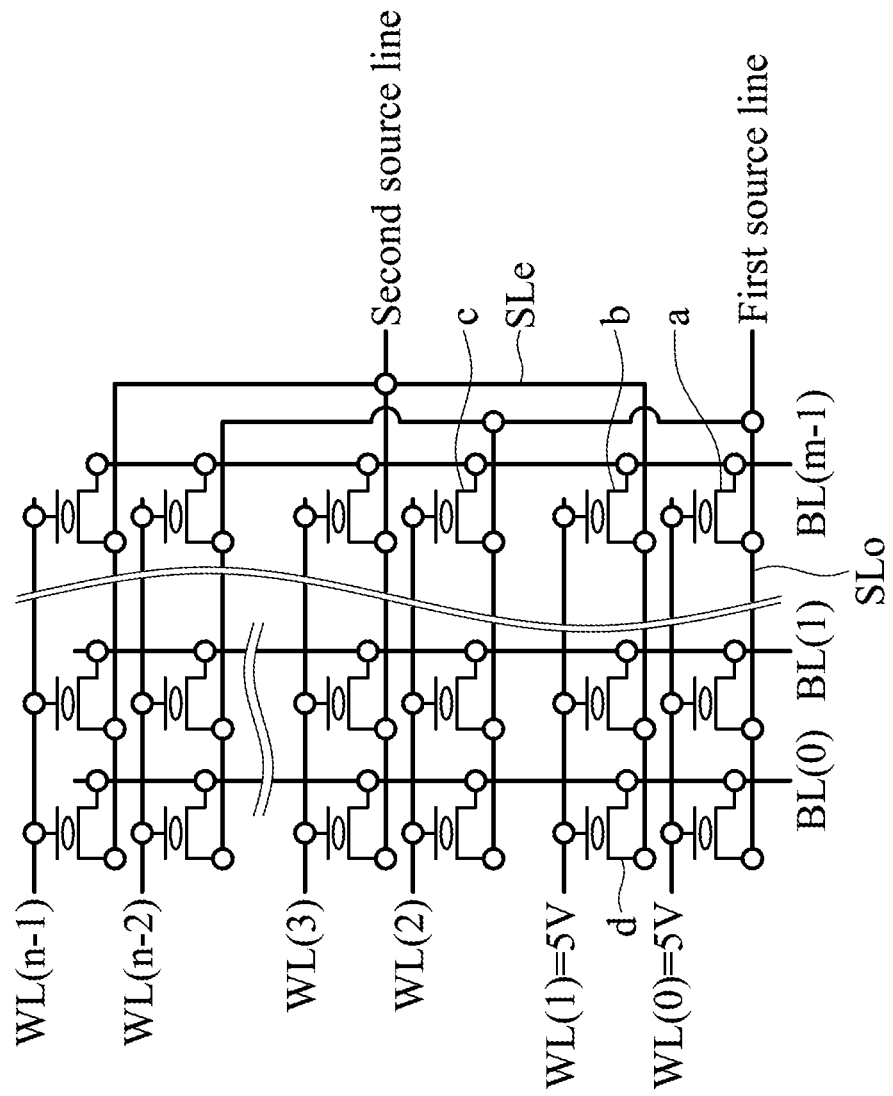
FIG. 4 is a schematic diagram of a memory array in accordance with an embodiment of the disclosure.

As shown in FIG. 3, a memory device 300 of an embodiment of the present invention includes a memory array 302, a word line controller 304, a source line controller 306, and a bit line controller 308. The memory device 300 may be a NOR flash memory. As shown in FIG. 4, the memory array 302 is comprised of a plurality of memory cells (such as memory cells a, b and c) arranged in n rows and in m columns, wherein n and m are positive integers. The gates of the memory cells in the same row are coupled to each other and connected to a word line. For example, gates of all the memory cells located in the first row (including the memory cell a) are coupled to each other and connected to a word line WL[0], and gates of all the memory cells located in the second row (including the memory cell b) are coupled to each other and connected to a word line WL[1].

The drains of the memory cells in the same column are coupled to each other and connected to a bit line. For example, drains of all the memory cells located in the first column (including memory cell d) are coupled to each other and connected to a bit line BL[0], and chains of all the memory cells located in the m-th column (including the memory cells a, b and c) are coupled to each other and connected to a bit line BL[m−1]. The sources of the memory cells in the same row are coupled to each other, and the sources of the memory cells in the two adjacent rows are respectively connected to a first source line and a second source line. For example, the first row where memory cell a is located is adjacent to the second row where memory cell b is located, and the sources of all the memory cells in the first row (including memory cell a) are coupled to each other and connected to a first source line SLo, and the sources of all the memory cells in the second row (including memory cell b) are coupled to each other and connected to a second source line SLe.

Refer to FIG. 3 and FIG. 4 at the same time, for example, when the memory cell a is a target memory cell for reading, the word line controller 304 provides a first voltage (5V in FIG. 4) to the word line WL[0] corresponding to the memory cell a and also provides the first voltage to a word line WL[1] corresponding to the next row of memory cells a, so that the period when the word line WL[0] corresponding to the memory cell a remains at the first voltage overlaps the period when the word line WL[1] corresponding to the next row of memory cells a remains at the first voltage. When a memory cell a needs to be read, the source line controller 306 provides a second voltage to the first source line SLo, and provides a third voltage to the second source line SLe. The second voltage is equal to 0V, and the third voltage is higher than the second voltage, for example 1V. When the memory cell a needs to be read, the bit line controller 308 provides the third voltage (1V) to the bit line BL[m−1] corresponding to the memory cell a.

Figure 5:
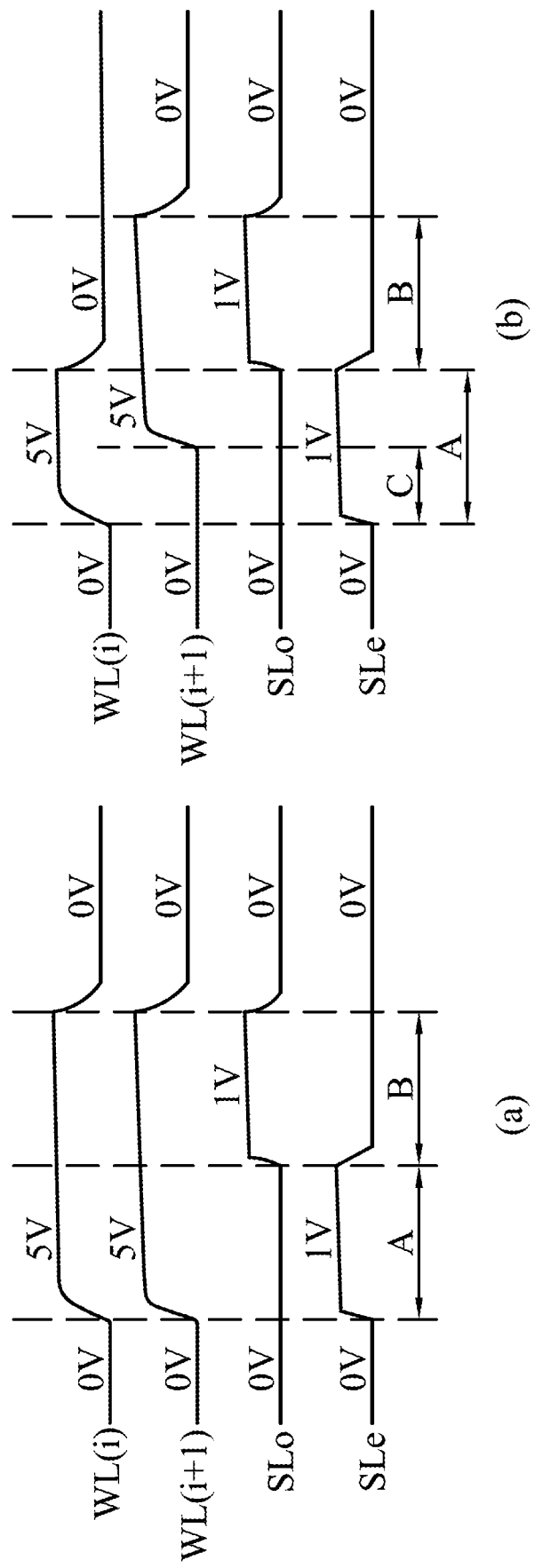
FIG. 5 is a schematic diagram showing voltage time sequence controlled by a word line controller and a source line controller in accordance with the embodiment of the disclosure.

FIG. 5 is a schematic diagram showing voltage time sequence controlled by a word line controller 304 and a source line controller 306 in accordance with the embodiment of the disclosure. FIG. 5 is exemplified only by the word line WL[0] in the first row and the word line WL[1] in the second row in FIG. 4. Refer to FIG. 4 and FIG. 5(a) at the same time, for example, when the memory cell a located in the first row in the FIG. 4 is read during a period A, the word line controller 304 simultaneously provides 5V to the word line WL[0] corresponding to the memory cell a and the word line WL[1] corresponding to the next row of memory cells a, thus the voltage at the word lines WL[0] and WL[1] rises from 0V to 5V at the beginning of the period A. The bit line controller 308 also provides 1V to the bit line BL[m−1] corresponding to the memory cell a. The source line connected to the source of the memory cell a is the first source line SLo. When the memory cell a is read during the period A, the source line controller 306 provides 0V to the first source line SLo, and provides 1V to the second source line SLe, so that only the memory cell a can be read. The memory cell b cannot be read because its source voltage (the voltage at the second source line SLe=1V) is equal to its drain voltage (the voltage at the bit line BL[m−1]=1V). The source line connected to the memory cell d is the second source line SLe. When the memory cell d is read during period B, the word line controller 304 still provides 5V to the word line WL[0] corresponding to the memory cell a and the word line WL[1] corresponding to the memory cell d, the bit line controller 308 provides 1V to the bit line BL[0] corresponding to the memory cell d, and the source line controller 306 provides 0V to the second source line SLe, and provides 1V to the first source line SLo, so that only the memory cell d can be read. The memory cell a cannot be read because its drain voltage is equal to 0V (the voltage at the bit line BL[m−1]=0V).

Refer to FIG. 4 and FIG. 5(b) at the same time, for example, when the memory cell a located in the first row in the FIG. 4 is read during a period A, the word line controller 304 first provides 5V to the word line WL[0] corresponding to the memory cell a, and after a delay period C, the word line controller 304 then provides 5V to the word line WL[1]

corresponding to the next row of memory cells a. The bit line controller 308 also provides 1V to the bit line BL[m−1] corresponding to the memory cell a. When the memory cell a is read during the period A, the source line controller 306 provides 0V to the first source line SLo, and provides 1V to the second source line SLe, so that only the memory cell a can be read. The memory cell b cannot be read because its source voltage (the voltage at the second source line SLe=1V) is equal to its drain voltage (the voltage at the bit line BL[m−1]=1V). When the memory cell d is read during a period B, the word line controller 304 stops providing 5V to the word line WL[0] corresponding to the memory cell a, but still provides 5V to the world line WL[1] corresponding to the memory cell d, the bit line controller 308 provides 1V to the bit line BL[0] corresponding to the memory cell d, and the source line controller 306 provides 0V to the second source line SLe, and provides 1V to the first source line SLo, so that only the memory cell d can be read.

In detail, as shown in FIG. 4, memory cell a is located in the first row of the last column in the memory array 302, memory cell b is located in the second row of the last column, memory cell c is located in the third row of the last column, and memory cell d is located in the second row of the first column. When the memory device 300 receives a read command (especially a fast read command), the memory device 300 will start to read the memory cell in sequence from the first row of first column in the memory array 302, and after reading the memory cell a at the first row of the first column, the memory cell d at the second row of the first column is continuously read until the reading of all the memory cells in the memory array 302 is completed. When the memory cell a is read, the voltage at the word line WL[0] connected to the memory cell a is 5V, the voltage at the bit line BL[m−1] is 1V, and the voltage at the first source line SLo is 0V, so that the memory cell a is turned on, and there is a current flowing from the drain to the source of the memory cell a. A detection circuit (no shown) in the memory device 300 is configured to determine whether data stored in the memory cell a are a logic high level or a logic low level in accordance with the magnitude of the current.

When the memory cell a is read, at the same tune, the voltage at the word line WL[1] connected to the memory cell b is 5V and the voltage at the bit line BL[m−1] is 1V, but the voltage at the second source line SLe is 1V, so the voltage at the drain and at the source of the memory cell b is the same (both are 1V), and no current is flowing from the drain to the source of the memory cell b. When the memory cell a is read, at the same time, the voltage at the word line WL[2] connected to the memory cell c is 0V, so that the memory cell c is turned off. When the memory cell a is read, at the same time, the voltage at the word line WL[1] connected to the memory cell d is 5V, the voltage at the bit line BL[0] is 0V, and the bit line BL[0] is not the bit line selected for reading, and therefore the memory cell d does not affect the reading state of the memory cell a. In other words, when the memory cell a is read, although the word line controller 304 provides 5V to both the word line WL[0] corresponding to the memory cell a and the word line WL[1] corresponding to the next row of memory cells a, the source line controller 306 conditionally controls the voltage at the first source line SLo and at the second source line SLe, and only the memory cell a to be read is turned on, thus the other memory cells do not affect the reading operation of the memory device 300, the time it takes for the memory device 300 to switch the word lines during a read command can be greatly reduced, and the reading efficiency of the overall memory device 300 can be improved.

As shown in FIG. 4, the first source line SLo is connected to the sources of the memory cells in odd rows of the memory array 302, and the second source line SLe is connected to the sources of the memory cells in even rows of the memory array 302. That is, the first source line SLo is connected to the sources of all memory cells in the first, third, fifth, . . . , etc. rows, which correspond to the word lines WL[0], WL[2], WL[4], . . . , etc. The second source line SLe is connected to the sources of all memory cells in the second, fourth, sixth, . . . , etc. rows, which correspond to the word lines WL[1], WL[3], WL[5], . . . , etc.

Figure 6:
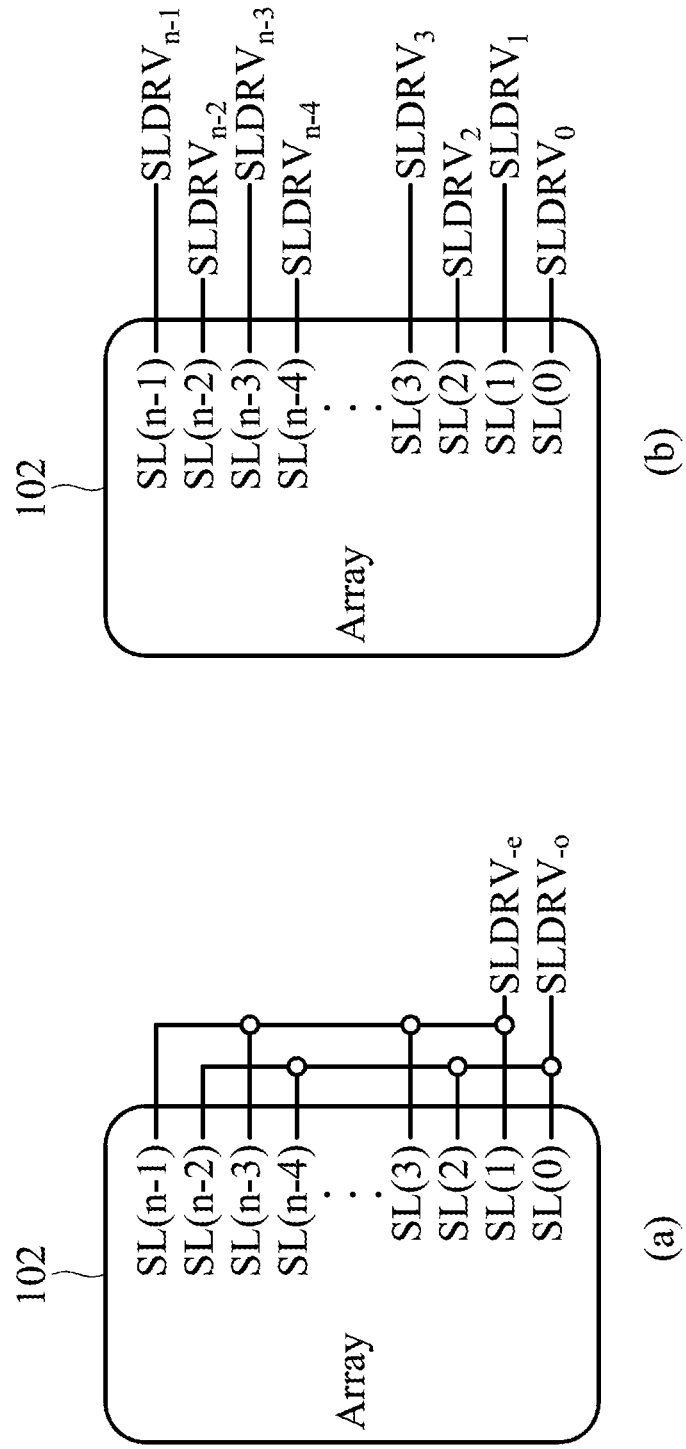
FIG. 6 is a configuration diagram of the source line controller and the memory array in accordance with other embodiments of the disclosure.

FIG. 6 is a configuration diagram of the source line controller 306 and the memory array 302 in accordance with other embodiments of the disclosure. In other embodiments of the present invention, as shown in FIG. 6(a) source lines of the memory cells in odd rows of the memory array 302 are connected to a source line controller, and source lines of the memory cells in even rows of the memory array 302 are connected to another source line controller. For example, the source lines SL[0] and SL[1] are connected to a source line controller SLDRV-o, and the source lines SL[1] and SL[3] are connected to a source line controller SLDRV-e. As shown in FIG. 6(b), sources lines of the memory cells in each row in the memory array 302 are connected to different respective source line controllers. For example, the source line SL[0] is connected to a source line controller SLDRV0, the source line SL[1] is connected to a source line controller SLDRV1, and the source line SL[2] is connected to a source line controller SLDRV2.

Figure 7:
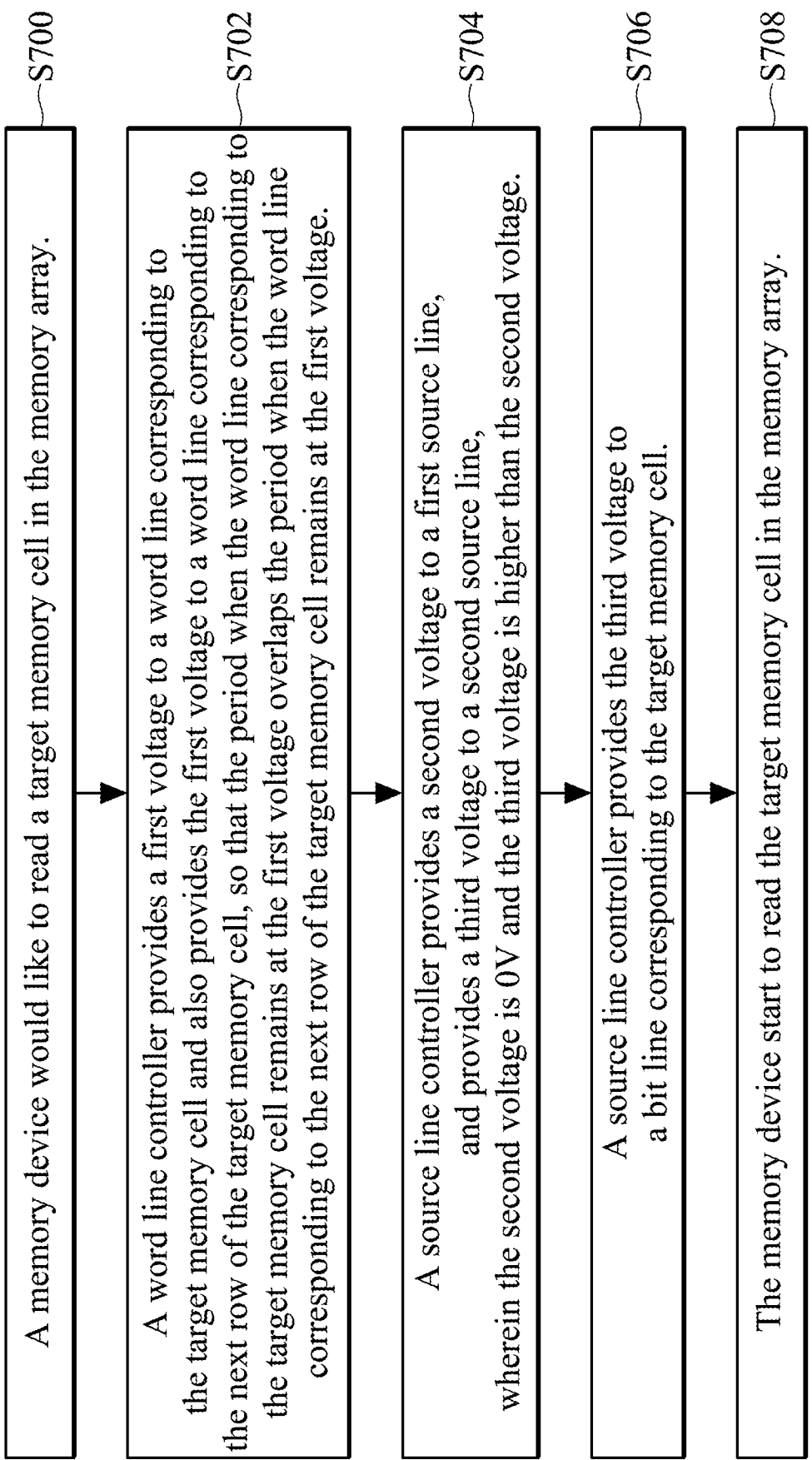
FIG. 7 is a flow chart of a control method of the memory device in accordance with the embodiment of the disclosure.

FIG. 7 is a flow chart of a control method of the memory device in accordance with the embodiment of the disclosure. As shown in FIG. 7, a memory device 300 would like to read a target memory cell in the memory array 302 (S700). A word line controller 304 provides a first voltage to a word line corresponding to the target memory cell and also provides the first voltage to a word line corresponding to the next row of the target memory cell, so that the period when the word line corresponding to the target memory cell remains at the first voltage overlaps the period when the word line corresponding to the next row of the target memory cell remains at the first voltage (S702). A source line controller 306 provides a second voltage to a first source line, and provides a third voltage to a second source line, wherein the second voltage is 0V and the third voltage is higher than the second voltage (S704). A source line controller 308 provides the third voltage to a bit line corresponding to the target memory cell (S706). Finally, the memory device 300 start to read the target memory cell in the memory array 302 (S708).

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term). In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A memory device, comprising:
a memory array, having a plurality of memory cells arranged in rows and columns; wherein gates of the memory cells in the same row are coupled to each other and connected to a word line; drains of the memory cells in the same column are coupled to each other and connected to a bit line; sources of the memory cells in the same row are coupled to each other, and sources of the memory cells in the two adjacent rows are connected to different respective source lines; wherein the different source lines comprise a first source line and a second source line; and
a word line controller, when a target memory cell whose source is connected to the first source line needs to be read, the word line controller provides a first voltage to a word line corresponding to the target memory cell and also provides the first voltage to a word line corresponding to the next row of the target memory cell, so that a period when the word line corresponding to the target memory cell remains at the first voltage overlaps a period when the word line corresponding to the next row of the target memory cell remains at the first voltage.

2. The memory device as claimed in claim 1, wherein the first source line is connected to sources of the memory cells in odd rows of the memory array; and the second source line is connected to sources of the memory cells in even rows of the memory array.

3. The memory device as claimed in claim 1, further comprising a bit line controller, and when the target memory cell needs to be read, the bit line controller provides a third voltage to a bit line corresponding to the target memory cell.

4. The memory device as claimed in claim 1, further comprising a source line controller, and when the target memory cell needs to be read, the source line controller provides a second voltage to the first source line, and provides a third voltage to the second source line; the third voltage is not equal to the second voltage.

5. The memory device as claimed in claim 4, wherein the second voltage is equal to 0V.

6. The memory device as claimed in claim 3, wherein when a voltage of the word line connected to the target memory cell is equal to the first voltage, a voltage of the bit line connected to the target memory cell is equal to the third voltage, and a voltage of the first source line is equal to 0V, the target memory cell is turned on, and there is a current flowing from the drain of the target memory cell to the source of the target memory cell.

7. The memory device as claimed in claim 6, wherein the memory device determines whether data stored in the target memory cell are a logic high level or a logic low level in accordance with the magnitude of the current.

8. The memory device as claimed in claim 3, wherein when a voltage of the word line connected to the target memory cell is equal to the first voltage, a voltage of the bit line connected to the target memory cell is equal to the third voltage, and a voltage of the first source line connected to the target memory cell is equal to the third voltage, a voltage at the drain of the target memory cell are the same as that at the source of the target memory cell, so that no current flows from the drain of the target memory cell to the source of the target memory cell.

9. The memory device as claimed in claim 1, wherein when a voltage of the word line connected to the target memory cell is equal to 0V, the target memory cell is turned off.

10. The memory device as claimed in claim 1, wherein the memory device is a NOR flash memory.

11. A control method of a memory device, wherein the memory device comprises a memory array, the memory array is comprised of a plurality of memory cells arranged in rows and columns; the gates of the memory cells in the same row are coupled to each other and connected to a word line; the drains of the memory cells in the same column are coupled to each other and connected to a bit line; the sources of the memory cells in the same row are coupled to each other, and the sources of the memory cells in the two adjacent rows are connected to different respective source lines; a first memory cell is located in a row of the plurality of rows and is located in the last of the plurality of columns; a second memory cell is located in a row next to the row where the first memory cell is located and is located in the last column; a third memory cell is located in a row next to the row where the second memory cell is located and is located in the last of the plurality of columns; a fourth memory cell is located in a row next to the row where the first memory cell is located and is located in the first of the plurality of columns; and when the first memory cell is read, the control method comprises:
providing a first voltage to a word line connected to the first memory cell, providing a second voltage to a source line connected to the first memory cell, and providing a third voltage to a bit line connected to the first memory cell, wherein the third voltage is higher than the second voltage;
providing the first voltage to a word line connected to the fourth memory cell, providing a fourth voltage to a source line connected to the second memory cell, and providing the second voltage to a source line connected to the third memory cell; wherein the fourth voltage is equal to the third voltage;
stopping the first voltage to the word line connected to the first memory cell;
wherein a period when the word line connected to the first memory cell remains at the first voltage overlaps a period when the word line connected to the second and fourth memory cell remains at the first voltage.

* * * * *